United States Patent [19]

Nelson et al.

[11] Patent Number: 5,119,073
[45] Date of Patent: Jun. 2, 1992

[54] AC RIPPLE METER

[76] Inventors: Glenn M. Nelson, 2511 Fourth St. NE., Minneapolis, Minn. 55418; Bradley C. Holmberg, 3128 E. 25th St., Minneapolis, Minn. 55406

[21] Appl. No.: 578,027

[22] Filed: Sep. 5, 1990

[51] Int. Cl.⁵ .............................................. G08B 21/00
[52] U.S. Cl. ................................... 340/661; 340/645; 324/119; 324/140 D
[58] Field of Search ............... 340/635, 645, 661; 363/46; 324/102, 119, 158 D, 158 MG, 140 D

[56] References Cited

U.S. PATENT DOCUMENTS

| 3,168,693 | 2/1965 | Eckenfelder . | |
|---|---|---|---|
| 3,210,603 | 10/1965 | Calfee et al. . | |
| 3,629,704 | 12/1971 | Stevens | 324/158 MG |
| 4,147,610 | 4/1979 | Larson . | |
| 4,240,881 | 12/1980 | Stanya . | |
| 4,242,674 | 12/1980 | Wheeler | 340/635 |
| 4,520,310 | 5/1985 | Kelley et al. | 324/115 |
| 4,694,193 | 9/1987 | Schlenk et al. . | |

*Primary Examiner*—Jin F. Ng
*Assistant Examiner*—Jeffery A. Hofsass
*Attorney, Agent, or Firm*—Faegre & Benson

[57] ABSTRACT

An apparatus and method are disclosed for measuring and displaying the percentage of ac voltage ripple present on a direct current input voltage. In addition, the apparatus can be set to activate alarms and trip relays when the percentage of ac voltage ripple meets or exceeds a preset value.

12 Claims, 4 Drawing Sheets

AC RIPPLE METER

BACKGROUND OF THE INVENTION

When an alternating current voltage is converted by a rectifier into direct current voltage, a certain amount of ac ripple is left over in the resulting rectified dc voltage. In the electroplating industry, 3 phase rectifiers are often used to produce the necessary direct current voltage for the electroplating process. Failure of such a rectifier is often partial, resulting in an increased and potentially damaging load on the remaining working components of the rectifier and increased ac voltage ripple. Increased ripple can adversely affect the quality of products made by the electroplating process. Printed circuit boards are especially sensitive to increased ripple during the electroplating process. Moreover, partial failure of the rectifier is often difficult to detect until the product is examined and found to be defective.

A ripple meter provides a means for detecting and monitoring the percentage of ripple in a direct current voltage. When the meter indicates a percentage of ripple above acceptable levels, the problem may be addressed immediately. Such a warning serves two purposes. First, if the dc rectifier is at fault, it may be repaired before the increased load on the working components burns them out. Burn out of additional dc rectifier components could substantially increase repair costs. Second, the problem may be addressed before a substantial amount of electroplating product is ruined by high levels of ripple.

The prior art shows various devices for detecting a ripple component of a dc voltage, but, at best, they merely compare the ripple component to a reference voltage independent of the input voltage. They do not display a comparison of the ripple component to the input voltage as a percentage of the input voltage.

Showing the ripple voltage as a percentage of the input voltage is advantageous for certain applications, such as for monitoring an electroplating voltage produced by a 3 phase rectifier. The voltage of an electroplating rectifier may be changed from one batch to the next without readjustment of the meter since the same percentages of ripple are often acceptable from batch to batch even though the electroplating voltage has changed. However, where ripple voltage in an electroplating rectifier voltage is measured against a reference voltage, the reference voltage must be reset each time the rectifier voltage is changed.

For example, U.S. Pat. No, 4,242,674 to Wheeler relates to a detector for triggering an alarm when the alternating current component of the mainly dc current output produced by an aircraft alternator with solid state diode rectifiers reaches a predetermined level symptomatic of incipient failure of some component of the alternator or rectifier. Wheeler does not measure or indicate a ripple percentage of the output voltage. Rather, an alarm is activated when any significant ac ripple exists in the dc voltage.

U.S. Pat. No. 4,520,310 to Kelly et al. relates to a voltmeter automatically switches from ac mode to dc mode and vice versa when an ac component reaches a predetermined threshold. Absolute voltages are measured by the device, and reference voltages are set to establish values to initiate switchover from mode to mode. The device may also indicate that an ac ripple component exists with dc voltage, but does not indicate the percentage that the ripple represents.

U.S. Pat. No. 4,694,193 to Schlenk, et al. relates to a fault recognition current for parallel power supply devices. It compares separate reference voltages to each of the ac and dc voltage components of an input voltage from a set of parallel power supplies to detect failure of at least one power supply out of the set of parallel power supplies.

U.S. Pat. No. 3,210,603 to Calfee, et al. relates to a generator protector which detects increases in ripple current in the output voltage of a brushless alternating current generator and shuts down the exciter field in response thereto. The percentage of ripple is not detected or shown by this device.

DETAILED DESCRIPTION OF THE INVENTION

Figure 1:
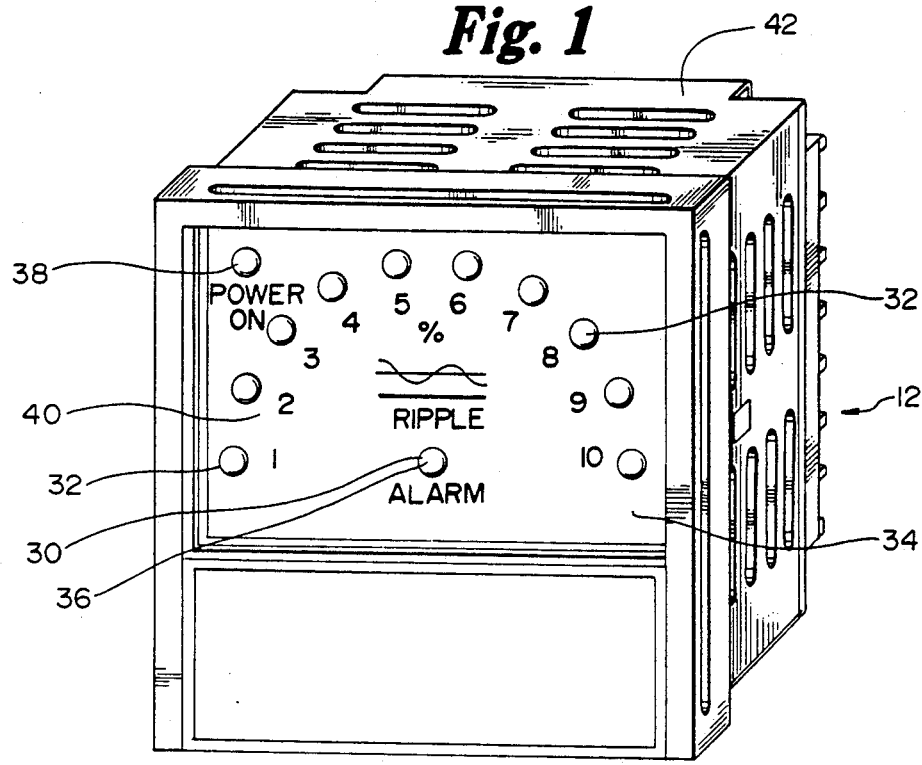
FIG. 1 is a perspective view of a preferred embodiment of the ripple meter.

FIG. 1 shows a preferred embodiment of a ripple meter 12 having a front face 34 showing an arrangement of a series of percentage display lights 32. The preferred embodiment shown has ten such lights arranged in an arc on the front face 34 of the meter although the number of lights actually used is not critical. In addition to the indicator lights, the meter 12 also has an alarm display means 30 comprising an alarm light 36. A power light 38 indicates when the meter 12 has power.

The face 34 is labeled to show the functions of each of the lights 30, 32, 36, 38 preferably with the numbers one through ten. An outer case 42 of the meter 12 is constructed and arranged so that it may be received into a panel of a larger device such as a dc electroplating rectifier (not shown) which generates a dc electroplating voltage to power an electroplating process.

Figure 2:
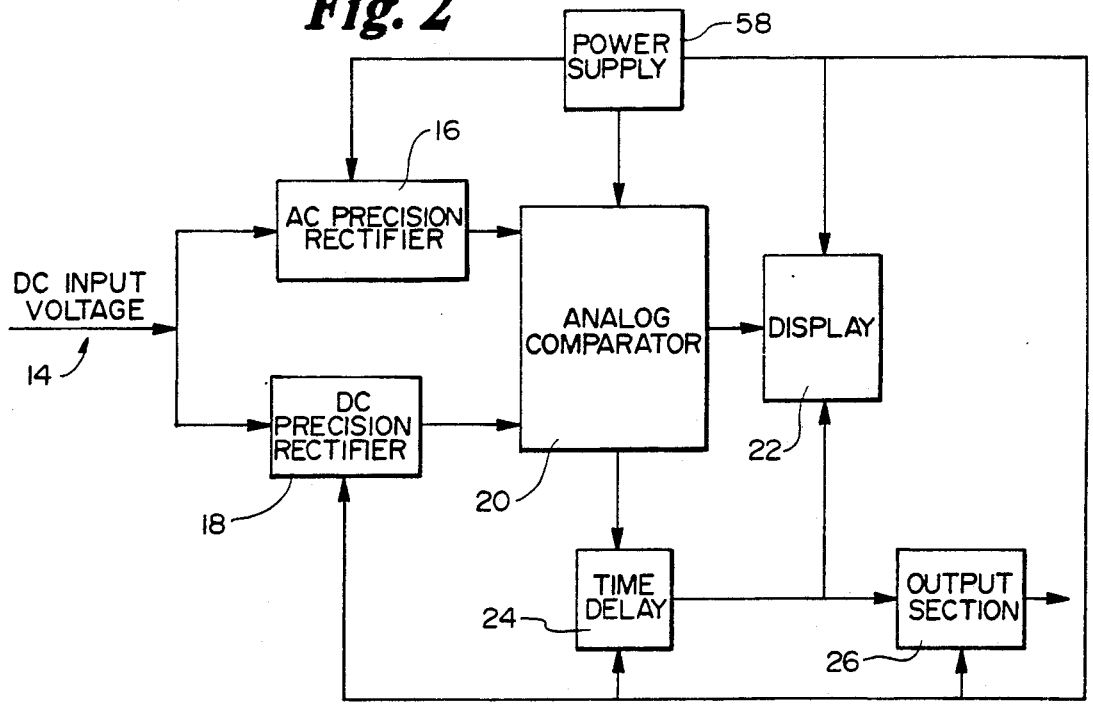
FIG. 2 is a block diagram showing a the relationship between elements of a preferred embodiment of the ripple meter.

FIG. 2 is a block diagram of a preferred embodiment of the meter 12. The input voltage 14 flows into the ac precision rectifier 16 and the dc precision rectifier 18. The ac precision rectifier 16 converts an ac voltage component of the input voltage 14 into a first dc voltage. The dc precision rectifier 18 filters out the ac voltage component ("ripple") from the input voltage 14, producing a second dc voltage corresponding to a dc component of the input voltage 14.

The first and second dc voltages are compared by an analog comparator 20 to determine a percentage that the first voltage is of the second voltage. The percentage is displayed by a display 22 preferably made up of a series of percentage display lights 32 corresponding to an incremental series of percentages.

The meter 12 preferably has an adjustable alarm circuit relay 26 designated in FIG. 2 as "output section".

The alarm circuit relay 26 can be set to trip when the first dc voltage reaches or surpasses a certain pre-set percentage of the second dc voltage. In the preferred embodiment, an alarm light 36 on the face 34 of the meter 12 will immediately flash when the first ac voltage reaches or surpasses the predetermined percentages of the second voltage. The alarm circuit relay 26, however, preferably is connected to the comparator 20 through a time delay circuit 24 which delays tripping the alarm circuit relay 26 unless the percentage determined by the comparator remains above the pre-set value for a sufficient time to minimize false tripping of the alarm circuit relay 26 due to momentary or transient voltage fluctuations. A delay period of approximately five seconds is preferred. The alarm circuit relay 26 is preferably connected to an audio alarm (not shown) or a visual alarm (not shown). The alarm circuit relay 26 can also initiate shut down of apparatus such as an electroplating rectifier (not shown) which generates the input voltage 14.

Alternatively, the alarm light 36 may be connected to the time delay circuit 24 so that the alarm light 36 does not flash until the alarm circuit relay 26 is tripped.

A power supply 58 supplies the meter with power.

DETAILED DESCRIPTION OF ELECTRICAL SCHEMATICS

Figure 3:
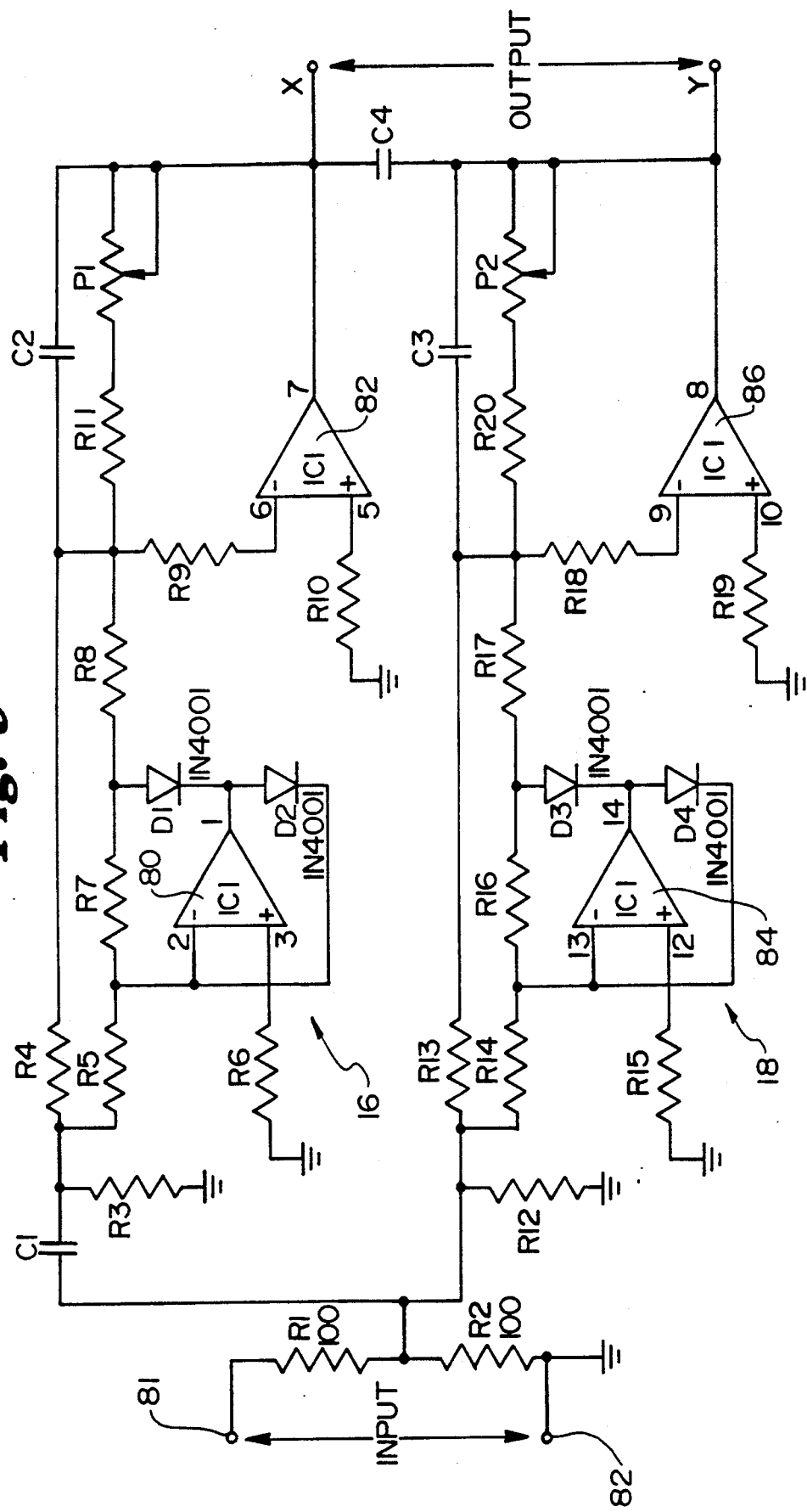
FIG. 3 is a circuit diagram showing the schematics of preferred embodiments of both the precision ac rectifier and the precision dc rectifier.

Referring now to FIG. 3, a schematic of the ac precision rectifier 16 and dc precision rectifier 18 of the block diagram of FIG. 2 can be seen. The input voltage which is to be monitored is applied across the input terminals and the voltage divider formed by resistors R1 and R2. In applications where the present invention is of particular utility, the voltage is typically a dc voltage upon which a ripple ac voltage is superimposed. Such voltages are typical of the output voltages of various rectifier arrangements commonly utilized with electroplating apparatus, for example.

The voltage across resistor R2 is connected to capacitor C1, which blocks the dc component of the input and allows only the ac component or the ripple voltage to be applied across resistor R3. That signal is then applied through resistor R5 to a basic halfwave rectifier comprised of an operational amplifier 80, diodes D1 and D2 and resistors R5, R6 and R7. The halfwave rectifier 16 has diodes D1 and D2 connected to provide a negative output when positive input signals are applied at R5. Forward biasing of diode D1 by the negative output signal causes a negative feedback path to be established through resistor R7. Since resistors R7 and R5 are closely matched, the inverted gain of amplifier 80 is almost exactly unity for positive input signals. When the amplifier output is positive, D1 is OFF, D2 is ON, applying negative feedback to the summing point and clamping the operational amplifier to the diode bias offset voltage of positive 0.6 volts. This clamped output aids in minimizing the response time of the rectifier by preventing amplifier saturation. The output of the halfwave rectifier 16 is summed with the ac signal through resistor R4 by operational amplifier 82 which has a low pass filter in the negative feedback path comprised of resistors R11 and P1 and capacitor C2. The effect of the low pass filter in the feedback path of amplifier 82 is to smooth the output voltage at X by removing virtually the entire remaining ac ripple component.

Thus, the output voltage at X is voltage proportional to the full wave rectified ripple component of the input voltage. By selecting the resistance values appropriately, gains can be set to allow for the conversion from RMS and average ac values to allow the output voltage X to be a dc voltage having a magnitude equal to the RMS value of the input ripple on the input voltage. The value of capacitor C2 and resistors R11 and P1 are chosen to establish an RC time constant for the low pass filter which is appreciably longer than the period of the lowest input frequency to be measured.

Using a feed forward type circuit for the half wave rectifier as is shown in FIG. 3, the accuracy of the rectifier is maintained for relatively high frequencies.

The same precision rectifier circuitry described for the ac precision rectifier 16 is used with amplifiers 84 and 86 in the dc precision rectifier lower portion of FIG. 3 to rectify and stabilize the dc component of the input voltage as it appears across resistor R12. Thus, the X signal in FIG. 3 is a dc voltage which is equal to the RMS value of the ac ripple appearing on the input signal while the Y voltage is a dc voltage which is equal to the dc component of the input voltage being monitored. As both full wave rectifiers are filtered and very stable and made from identical circuit components, the X and the Y voltages are both stable dc voltages and quite accurately determined. The ratio of the X magnitude to the Y magnitude is a direct measure of the ripple magnitude as a percentage of the voltage with which it appears.

Figure 4:
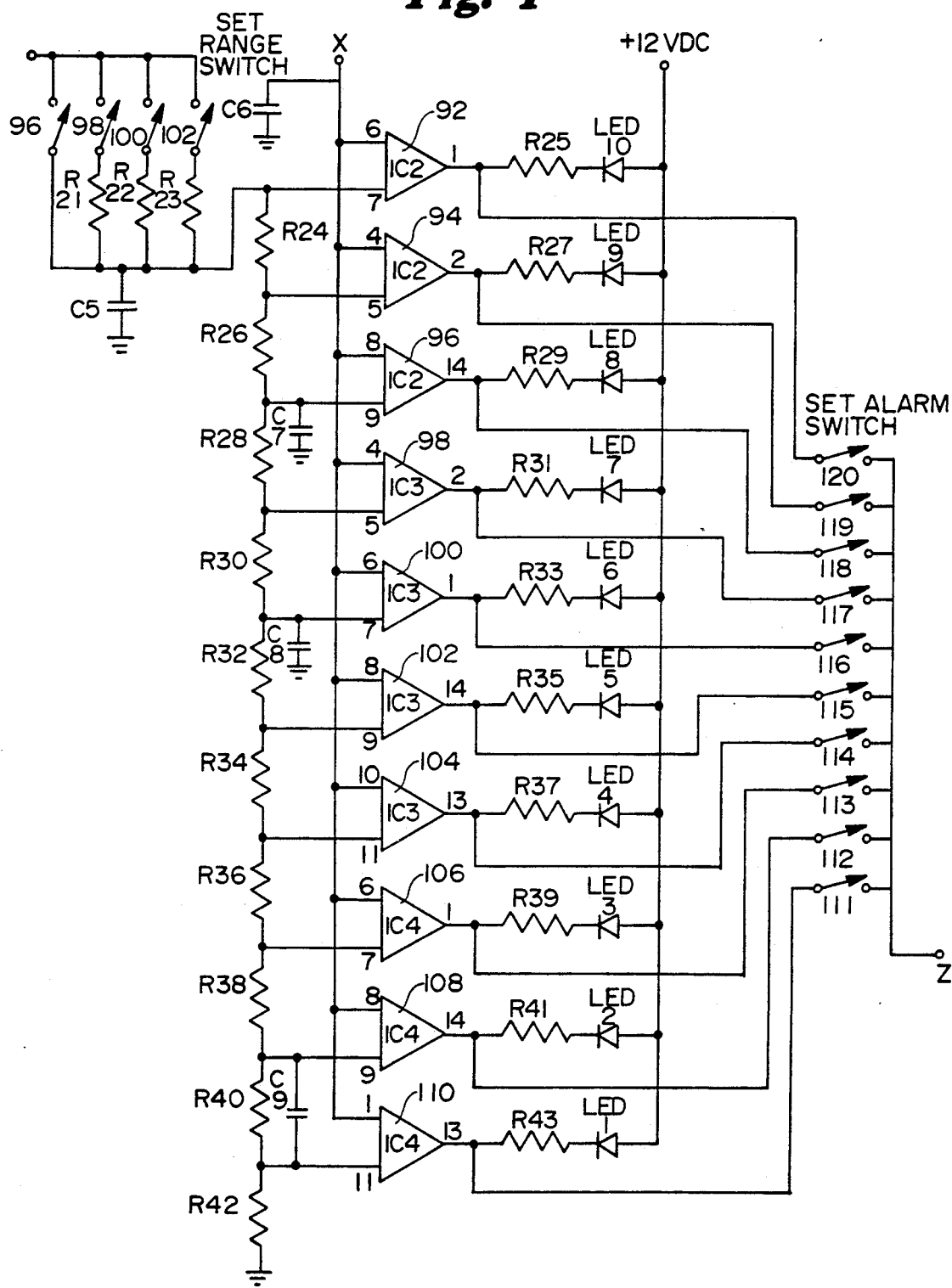
FIG. 4 is a circuit diagram showing the schematics of preferred embodiments of both the analog comparator and the percentage display lights, and the alarm set switches.

The X signal of FIG. 3 is connected to the X terminal on FIG. 4 while the Y signal is connected to the Y terminal on FIG. 4. The Y signal, representing the dc voltage, is applied to the multilegged voltage divider formed of resistors R24, R26, R28, R30, R32, R34, R36, R38, R40 and R42. The connections between those resistors are each connected to one of the reference input terminals of the comparator units 92, 94, 96, 98, 100, 102, 104, 106, 108, and 110 while the other comparator input terminals are all connected to receive the dc signal X, representative of the ripple magnitude.

The adjustment range of the voltage divider is altered by selecting with the set range switch (contacts 96, 98, 100 and 102) one of the paths either through a direct connection or through resistor R21, R22 or R23 to change the division ratio of the taps of the voltage divider. At any particular time, the ripple voltage X is compared to the divided dc voltage Y and one or more of the comparators triggered to provide a ground at its output terminal when its threshold point is passed. For example, if a ripple range percentage is selected switch contacts 90, 98, 100 or 102 to be between 1 and 10 percent, and if the ripple detected is 3 percent, three of the comparators will have their output switch from a positive voltage to 0 and their respective LEDs 1, 2 and 3 will be illuminated.

Figure 5:
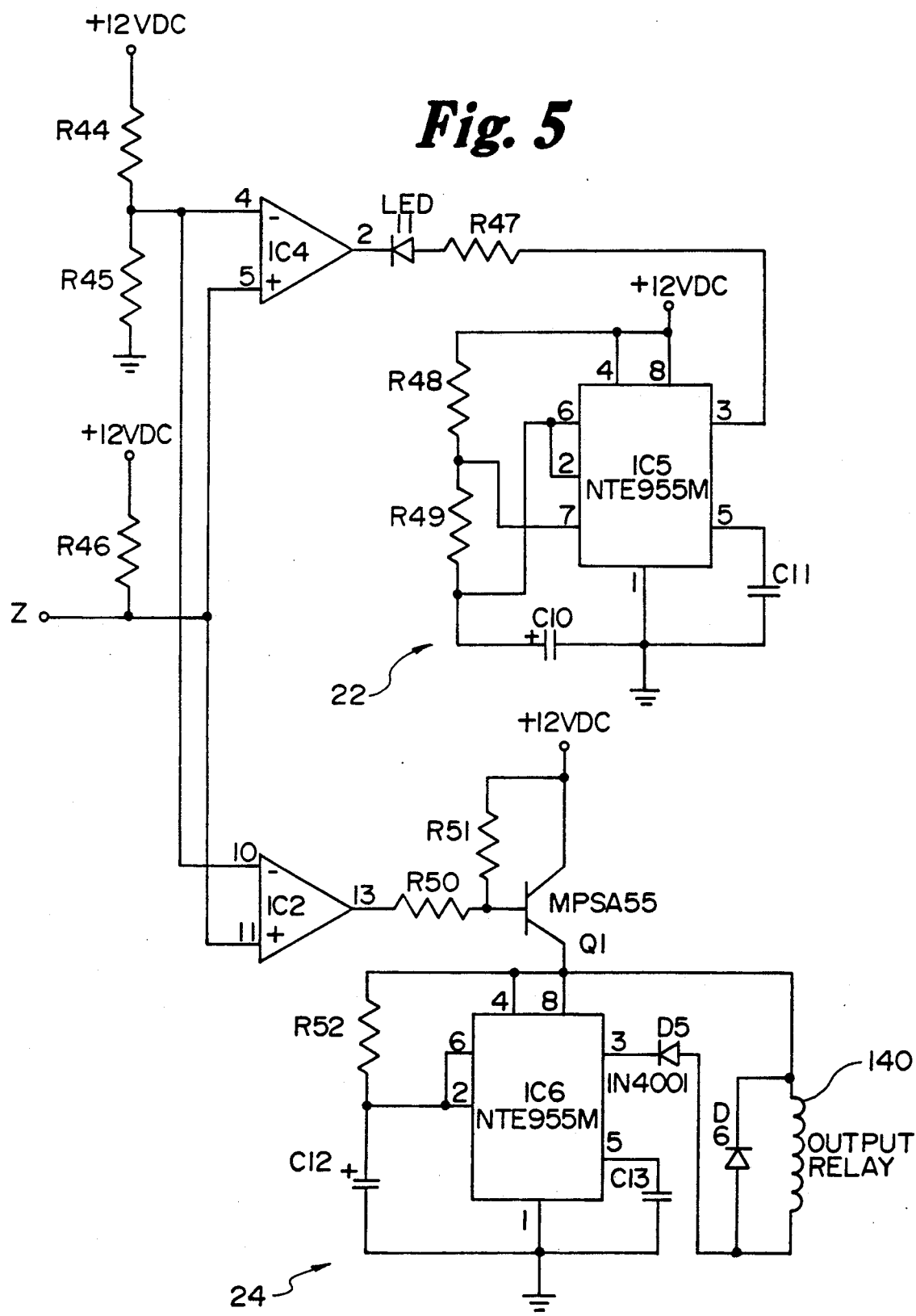
FIG. 5 is a circuit diagram showing the schematics of preferred embodiments of the time delay feature, the alarm light and the output relay.

An alarm signal 7 is generated by setting the alarm switch shown in FIG. 4 to close one of the sets of terminals 111–120 so that when its associated comparator is triggered, the voltage drop at its output is communicated to the Z terminal as an electrical alarm indication to the circuitry of FIG. 5.

In FIG. 5, the Z signal is connected to the noninverting input of the IC 4 operational amplifier and to the noninverting input of the operational amplifier IC2. The IC 4 circuitry is used to drive LED 11 which indicates the presence of an alarm condition caused by the detected ripple component of the monitored voltage exceeding the threshold selected by the setting of the appropriate switch contacts of the alarm switches shown in FIG. 4.

LED 11 is illuminated when two conditions are satisfied. The first is when the Z signal is LOW indicating that the ripple percentage exceeds the threshold percentage selected by switch 110. The second condition is when the output at pin 3 of the timer circuit IC5 is at a positive voltage. The timer of IC5 is shown in FIG. 5 connected as an astable timer in accordance with well known application notes. The timing components for the circuit are R48, R49 and C10, the timer IC5 itself and the bypass capacitor C11. When the component values indicated for this preferred embodiment of the invention are used, an alternating output signal is produced on terminal 3 which illuminates the alarm annunciator LED 11 when the Z signal is in the LOW, or ALARM condition.

The portion of the circuitry of FIG. 5 which is related to IC6 is a time delay circuit for driving the winding 140 of the output relay after a preselected time delay has been exceeded. IC6 is a timer integrated circuit connected to provide a time delay in a well known arrangement of components. Capacitor C12 is charged through resistor R52 at a rate determined by their combined time constant. When IC6 times out a predetermined time after the application of a voltage to power terminal 8, an event which occurs when the Z signal switches from HIGH to LOW to denote a ripple percentage in excess of the threshold, Q1 is turned ON and applies a positive voltage to terminal 8 of IC6 and the R52-C12 timing circuit.

A set of four switches are shown in the preferred embodiment for setting the range with the values selected as follows: the first being set for ripple voltages between one and ten percent, the second between two and twenty percent, the third between five and fifty percent and the fourth between ten and one hundred percent. The display lights 22 of the meter can be read as percentage of ripple by multiplying the numbers corresponding to the lights by one when the first range switch 160 is set, two when the second range switch 162 is set, five when the third range switch 164 is set and ten when the fourth range switch 166 is set.

In the preferred embodiment shown, the components indicated in FIGS. 3-5 may have the following characteristics:

| Resistors | |
|---|---|
| R1 | 100 L |
| R2 | 100 L |
| R3 | 100K |
| R4 | 20K |
| R5 | 20K |
| R7 | 20K |
| R6 | 15K |
| R8 | 10K |
| R9 | 1K |
| R10 | 6.2K |
| R11 | 20K |
| R12 | 100K |
| R14 | 20K |
| R16 | 20K |
| R17 | 10K |
| R18 | 1K |
| R20 | 20K |
| R19 | 6.2K |
| R21 | 10K |
| R22 | 30K |
| R23 | 90K |
| R24 | 1K |
| R26 | 1K |
| R28 | 1K |
| R30 | 1K |
| R32 | 1K |
| R34 | 1K |
| R36 | 1K |
| R38 | 1K |
| R40 | 1K |
| R42 | 1K |
| R25 | 1K |
| R27 | 1K |
| R29 | 1K |
| R31 | 1K |
| R33 | 1K |
| R35 | 1K |
| R37 | 1K |
| R39 | 1K |
| R41 | 1K |
| R43 | 1K |
| R44 | 10K |
| R45 | 10K |
| R46 | 10K |
| R47 | 1K |
| R48 | 10K |
| R40 | 10K |
| R51 | 2.2K |
| R50 | 2.2K |
| R52 | 1M |
| Capacitors: | |
| C1 | 1 mF |
| C2 | 10 mF |
| C4 | 0.22 mF |
| C3 | 10 mF |
| C5 | 0.1 mF |
| C6 | 0.22 mF |
| C7 | 0.01 mF |
| C8 | 0.01 mF |
| C9 | 0.01 mF |
| C10 | 15 mF |
| C11 | 0.01 mF |
| C12 | 10 mF |
| C13 | 0.01 mF |
| Comparators: | |
| IC1 | LM324 |
| IC2 | MC3302P |
| IC3 | MC3302P |
| IC4 | MC3302P |
| Timer Circuits | |
| IC5 | NTE955M |
| IC6 | NTE955M |
| Transistor | |
| 328 | MPSA55 |

Diodes D1-D6 are all 1N4001.

Although the present invention has been described with reference to preferred embodiments, workers skilled in the art will recognize that changes may be made in form and detail without departing from the spirit and scope of the invention.

What is claimed is:

1. A monitor for measuring an ac ripple component of an output voltage of a bridge rectifier as a percentage of the output voltage, the monitor comprising, in combination:

first rectifier means for converting the ripple component into a first dc voltage equal to a magnitude of the ac ripple appearing at an output of the bridge rectifier;

second rectifier means for converting the ac component and a dc component of the bridge rectifier output voltage into a second dc voltage equal to a magnitude of the rectifier output;

ratio determining means connected to receive the first and second dc voltages and for providing an output alarm indication when a ratio of the first dc voltage to the second dc voltage exceeds a selected threshold magnitude; and display means for displaying the alarm indication.

2. The apparatus according to claim 1 wherein the display means comprises an alarm light.

3. The apparatus according to claim 1 further comprising a series of percentage indicator lights corresponding to a series of threshold percentages of the second dc voltage, the lights sequentially lighting in response to the first dc voltage exceeding the corresponding threshold percentage of the second dc voltage and which sequentially extinguish in response to the first dc voltage decreasing below the corresponding threshold percentage of the second dc voltage.

4. The apparatus according to claim 1 having an alarm circuit relay which trips upon the first direct current voltage reaching a predetermined threshold percentage of the second direct current voltage.

5. The apparatus according to claim 4 wherein the predetermined threshold percentage is adjustable.

6. The apparatus according to claim 4 further comprising a time delay circuit for delaying tripping of the alarm circuit relay for a predetermined delay period after the first direct current voltage reaches or exceeds the predetermined threshold percentage, the alarm circuit tripping only provided the first direct current voltage remains at or above the predetermined threshold percentage for the delay period.

7. A monitor for measuring an ac ripple component of an output voltage of a bridge rectifier as a percentage of a magnitude of the output voltage, the monitor comprising, in combination:

first rectifier means for converting the ripple component into a first dc voltage proportional to a magnitude of the ac ripple appearing at an output of the bridge rectifier;

second rectifier means for converting the ac component and a dc component of the rectifier output voltage into a second dc voltage having a magnitude proportional to a magnitude of the rectifier output voltage, said second rectifier means including switchable means for dividing the second voltage into a third dc voltage which is a predetermined percentage of the magnitude of the rectifier output voltage;

comparator means connected for receiving the first and third dc voltages and for providing an output alarm indication when the magnitude of the first dc voltage exceeds the magnitude of the third dc voltage; and display means for displaying the alarm indication.

8. The apparatus according to claim 7 further comprising a series of percentage indicator lights corresponding to a series of threshold percentages of the third dc voltage, the lights sequentially lighting in response to the first dc voltage exceeding the corresponding threshold percentage of the third dc voltage and which sequentially extinguish in response to the first dc voltage decreasing below the corresponding threshold percentage of the third dc voltage.

9. A method for determining a percentage magnitude of ac ripple present on an input voltage comprising the steps of:

separating an ac component of the input voltage from the input voltage;

converting the ac component into a first dc voltage having a magnitude equivalent to the magnitude of the ac component;

rectifying the input voltage to produce a second dc voltage proportional to an rms value of the input voltage;

comparing the magnitude of the first dc voltage with a magnitude of the second dc voltage to determine whether the first voltage exceeds one of a series of threshold percentages of the second dc voltage; and displaying the threshold percentages exceeded.

10. The method according to claim 9 comprising the additional steps of:

Setting a preset alarm threshold percentage of the second voltage;

Providing an alarm display means which will activate if the magnitude of the first dc voltage reaches or exceeds the alarm threshold percentage of the second dc voltage.

11. The method according to claim 9 comprising the additional step of:

Providing an alarm circuit relay which will trip if the magnitude of the first dc voltage reaches or exceeds the alarm threshold percentage of the second dc voltage.

12. The method according to claim 11 comprising the additional step of:

Providing a time delay means which will delay tripping the alarm circuit relay unless the magnitude of the first dc voltage remains at or above the preset alarm threshold percentage of the second dc voltage for a sufficient time to prevent false tripping of the relay due to momentary fluctuations in the percentage.

* * * * *